United States Patent
Kim et al.

(10) Patent No.: US 7,796,064 B2
(45) Date of Patent: Sep. 14, 2010

(54) PARALLEL-TO-SERIAL CONVERTER

(75) Inventors: Kyung-Hoon Kim, Kyoungki-do (KR);
Dae-Han Kwon, Kyoungki-do (KR);
Chang-Kyu Choi, Kyoungki-do (KR);
Taek-Sang Song, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 92 days.

(21) Appl. No.: 12/215,772

(22) Filed: Jun. 30, 2008

(65) Prior Publication Data

US 2009/0273493 A1    Nov. 5, 2009

(30) Foreign Application Priority Data

Apr. 30, 2008  (KR) .................. 10-2008-0040931
Apr. 30, 2008  (KR) .................. 10-2008-0040939

(51) Int. Cl.
*H03M 9/00*    (2006.01)
(52) U.S. Cl. ..................... 341/101; 327/407
(58) Field of Classification Search .......... 341/100, 341/101; 327/407
See application file for complete search history.

(56) References Cited

U.S. PATENT DOCUMENTS 6,437,725 B1 *  8/2002  Kwak et al. ............... 341/101
7,460,039 B2 * 12/2008  Jeon ......................... 341/100

FOREIGN PATENT DOCUMENTS

| JP | 05-315971 A | 11/1993 |
|----|-------------|---------|
| KR | 10-2005-0013810 A | 2/2005 |
| KR | 10-2007-0055911 A | 5/2007 |

* cited by examiner

*Primary Examiner*—Howard Williams
(74) *Attorney, Agent, or Firm*—Blakely, Sokoloff, Taylor & Zafman

(57) ABSTRACT

A parallel-to-serial converter includes a data input unit configured to receive a plurality of parallel data by using a plurality of clock signals having different phases, and a parallel-to-serial conversion unit configured to sequentially select and output an output signal of the data input unit by using a plurality of clock signals having a predetermined phase difference from the plurality of clock signals used in the data input unit.

25 Claims, 12 Drawing Sheets

PARALLEL-TO-SERIAL CONVERTER

CROSS-REFERENCES TO RELATED APPLICATIONS

The present invention claims priority of Korean patent application Nos. 2008-0040939 and 2008-0040931, both filed on Apr. 30, 2008, which are incorporated by reference in their entirety.

BACKGROUND OF THE INVENTION

The present invention relates to a parallel-to-serial converter, and more particularly, to a parallel-to-serial converter for converting parallel data into serial data using a plurality of different clock signals.

FIG. 1 is a circuit diagram of a conventional 4:1 parallel-to-serial converter.

Referring to FIG. 1, the conventional 4:1 parallel-to-serial converter includes flip-flops 101, 103, 105 and 107 and pass gates 109, 111, 113 and 115. The flip-flops 101, 103, 105 and 107 respectively output data DATA0, DATA1, DATA2 and DATA3 in synchronization with rising edges of four clock signals ICLKB, QCLKB, ICLK and QCLK having different phases and lower frequencies than a clock signal CLK. The pass gates 109, 111, 113 and 115 respectively select output signals of the flip-flops 101, 103, 105 and 107 during activation periods of selection clock signals CLKP0/CLKP0B, CLKP1/CLKP1B, CLKP2/CLKP2B and CLKP3/CLKP3B generated by combination of the four clock signals ICLKB, QCLKB, ICLK and QCLK having different phases.

The flip-flops 101, 103, 105 and 107 function to ensure a margin when the pass gates 109, 111, 113 and 115 select the output signals D0, D1, D2 and D3 of the flip-flops 101, 103, 105 and 107.

The selection clock signals CLKP0/CLKP0B, CLKP1/CLKP1B, CLKP2/CLKP2B and CLKP3/CLKP3B allow the pass gates 109, 111, 113 and 115 to select data without overlap when the parallel-to-serial converter serially outputs the parallel data DATA0, DATA1, DATA2 and DATA3. That is, the selection clock signals are made in a pulse form having a suitably adjusted pulse width of the output data.

The clock signals ICLK and QCLKB, the clock signals QCLK and ICLK, the clock signals ICLKB and QCLK, and the clock signals QCLKB and ICLKB are respectively input to NAND gates and inverters to output the selection clock signals CLKP0/CLKP0B, CLKP1/CLKP1B, CLKP2/CLKP2B and CLKP3/CLKP3B. The four clock signals ICLK, ICLKB, QCLK and QCLKB having the different phases are clock signals having a 90-degree phase difference.

Due to the 90-degree phase difference, the clock signals each passing through the NAND gate and the inverter are processed into the pulse-type selection clock signals CLKP0, CLKP1, CLKP2 and CLKP3 having a high level at a portion where high level periods overlap each other.

The clock signals ICLK, ICLKB, QCLK and QCLKB used herein are combined such that the data DATA0, DATA1, DATA2 and DATA3 are output without overlap. The selection clock signals CLKP0/CLKP0B, CLKP1/CLKP1B, CLKP2/CLKP2B and CLKP3/CLKP3B have a pulse form whose high level period is an enable period. Other combinations except the combination of FIG. 1 are also possible.

FIG. 2 is a timing diagram of the conventional 4:1 parallel-to-serial converter illustrated in FIG. 1.

Referring to FIG. 2, the selection clock signals CLKP0/CLKP0B, CLKP1/CLKP1B, CLKP2/CLKP2B and CLKP3/CLKP3B are made in a pulse form by combining the four clock signals ICLK, ICLKB, QCLK and QCLKB having the different phases. At this point, the enable periods of the selection clock signals CLKP0/CLKP0B, CLKP1/CLKP1B, CLKP2/CLKP2B and CLKP3/CLKP3B are not overlapped so that the output data A0, B0, C0 and D0 are output according to their data widths without overlap.

In this case, the selection clock signals CLKP0/CLKP0B, CLKP1/CLKP1B, CLKP2/CLKP2B and CLKP3/CLKP3B have a pulse width narrower than the high or low level periods of the four clock signals ICLK, ICLKB, QCLK and QCLKB having the different phases. That is, assuming that the enable periods of the four clock signals ICLK, ICLKB, QCLK and QCLKB having the different phases are the high or low level periods, it can be seen that the widths of the enable periods of the selection clock signals CLKP0/CLKP0B, CLKP1/CLKP1B, CLKP2/CLKP2B and CLKP3/CLKP3B become narrower than the enable periods of the four clock signals ICLK, ICLKB, QCLK and QCLKB having the different phases.

The reason why the system uses the low-frequency clock signals having the different phases is that it is difficult to use high-frequency clock signals because their high or low level periods have narrow widths and thus their swings are difficult. According to the related art, the four clock signals ICLK, ICLKB, QCLK and QCLKB having the different phases are processed into the pulse-type selection clock signals CLKP0/CLKP0B, CLKP1/CLKP1B, CLKP2/CLKP2B and CLKP3/CLKP3B whose enable periods are narrower than the four clock signals ICLK, ICLKB, QCLK and QCLKB. Therefore, the advantages that can be obtained when the low-frequency clock signals having the different phases may be diluted.

In addition, since the four clock signals ICLK, ICLKB, QCLK and QCLKB having the different phases are processed into a pulse form, the widths of their high or low level periods are reduced. Therefore, there is a limitation in swing for the selection clock signals CLKP0/CLKP0B, CLKP1/CLKP1B, CLKP2/CLKP2B and CLKP3/CLKP3B. The duty ratio may be varied. Therefore, the pass gates 109, 111, 113 and 115 may not exactly select the data D0, D1, D2 and D3.

Furthermore, since the data D0, D1, D2 and D3 are selected using the pass gates 109, 111, 113 and 115, the swing widths of the output data A0, B0, C0 and D0 may be restricted by junction capacitances of the pass gates 109, 111, 113 and 115 and jitters may also be caused.

SUMMARY OF THE INVENTION

Embodiments of the present invention are directed to providing a parallel-to-serial converter, which is capable of selecting and outputting data more correctly in a high frequency operation. More specifically, the data are selected and output by using a plurality of clock signals having different phases and a plurality of clock signals having phase difference from the clock signals, without processing the clock signals having the different phases into a pulse form having a narrower width than that of the high or low level period of the clock signals.

Embodiments of the present invention are also directed to providing a parallel-to-serial converter, which is capable of eliminating jitters caused by junction capacitances of pass gates because no pass gates are used.

In accordance with an aspect of the present invention, there is provided a parallel-to-serial converter, including: a data input unit configured to receive a plurality of parallel data by using a plurality of clock signals having different phases; and a parallel-to-serial conversion unit configured to sequentially select and output an output signal of the data input unit by using a plurality of clock signals having a predetermined phase difference from the plurality of clock signals used in the data input unit.

In accordance with another aspect of the present invention, there is provided a parallel-to-serial converter, including: a data input unit configured to receive a plurality of parallel data through four paths as valid data during enable periods of four clock signals having 90-degree phase difference; and a parallel-to-serial conversion unit configured to sequentially select output signals of the data input unit during enable periods of four clock signals having 90-degree phase difference from the four clock signals used in the data input unit.

In accordance with another aspect of the present invention, there is provided a parallel-to-serial converter, including: a data input unit configured to receive a plurality of parallel data by using a plurality of clock signals having different phases; a parallel-to-serial conversion unit configured to sequentially select output signals of the data input unit by using a plurality of clock signals having a predetermined phase difference from the plurality of clock signals used in the data input unit, and output serial data, wherein the parallel-to-serial conversion unit controls a drivability in outputting the serial data in response to a drivability control signal; and a data pattern detection unit configured to enable the drivability control signal when the serial data maintain the same logic level during more than a predetermined period and changes to an opposite logic level.

DESCRIPTION OF SPECIFIC EMBODIMENTS

Hereinafter, a parallel-to-serial converter in accordance with the present invention will be described in detail with reference to the accompanying drawings.

Figure 1:
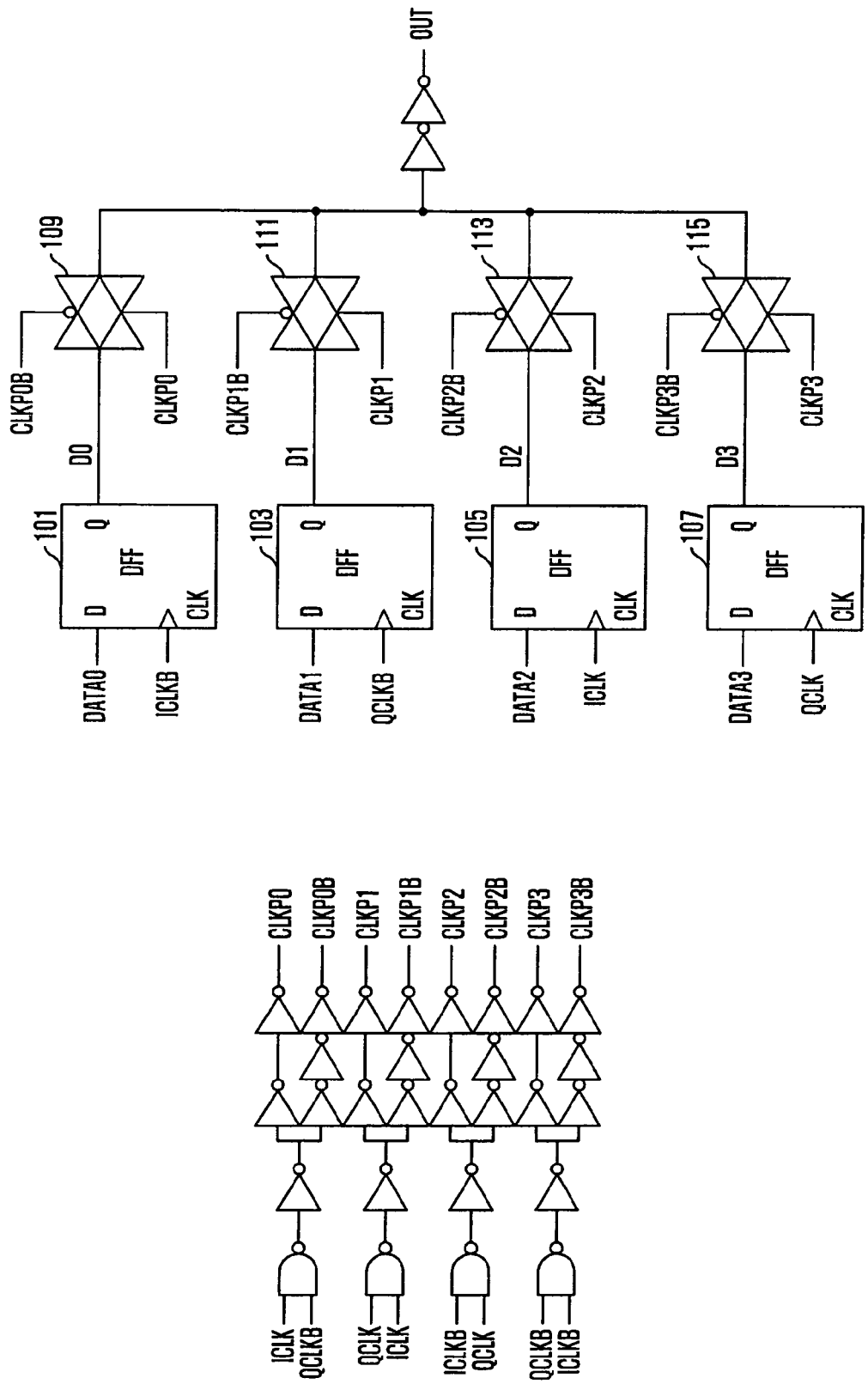
FIG. 1 is a circuit diagram of a conventional parallel-to-serial converter.
Figure 2:
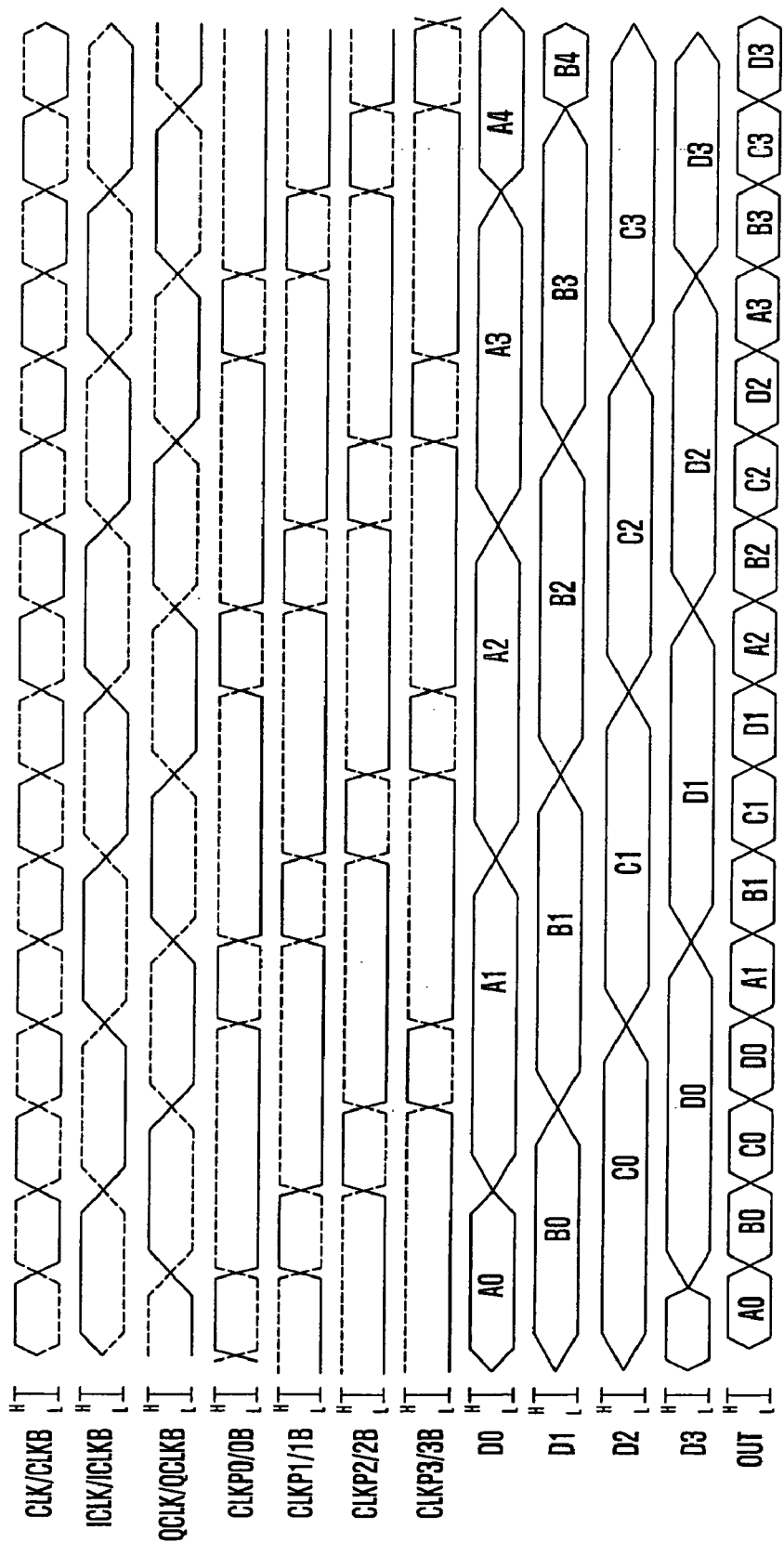
FIG. 2 is a timing diagram of the conventional parallel-to-serial converter illustrated in FIG. 1.
Figure 3:
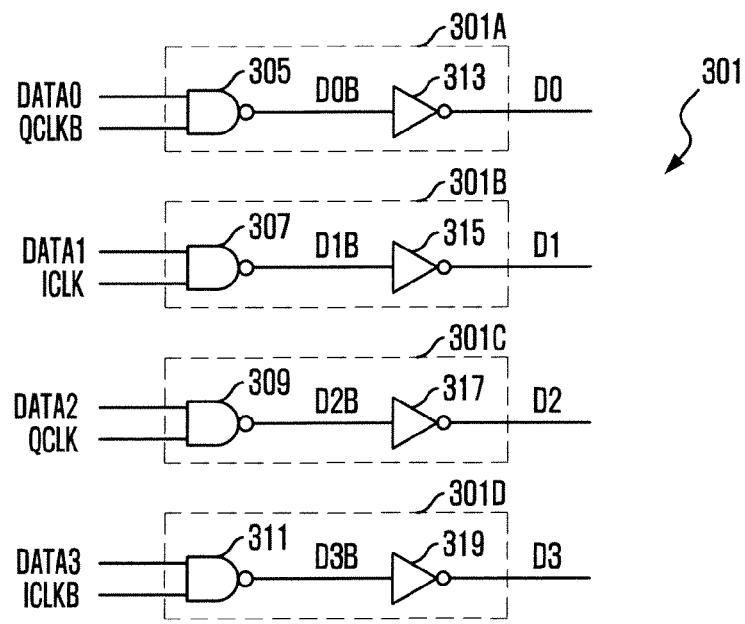
FIG. 3 is a circuit diagram of a parallel-to-serial converter in accordance with an embodiment of the present invention.
Figure 3:
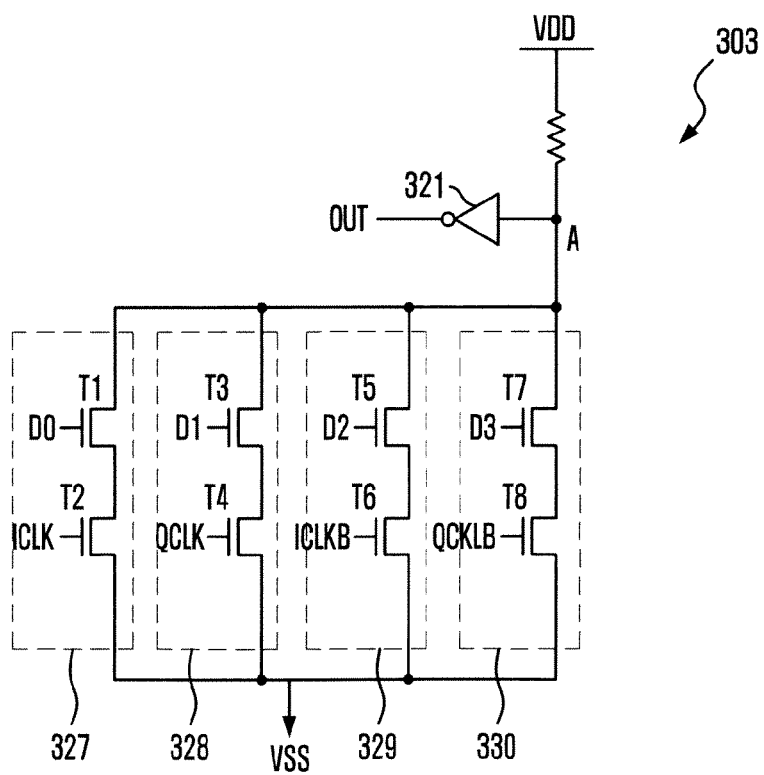

FIG. 3 is a circuit diagram of a parallel-to-serial converter in accordance with an embodiment of the present invention, especially a 4:1 parallel-to-serial converter that receives a plurality of data through four paths.

Referring to FIG. 3, the parallel-to-serial converter includes a data input unit 301 and a parallel-to-serial conversion unit 303. The data input unit 301 receives parallel data DATA0, DATA1, DATA2 and DATA3 as valid data through four paths at enable periods of four clock signals QCLKB, ICLK, QCLK and ICLKB having different phases. The parallel-to-serial conversion unit 303 sequentially selects and outputs the output signals of the data input unit 301 during the enable periods of the four clock signals ICLK, QCLK, ICLKB and QCLKB having a 90-degree phase difference from the four clock signals QCLKB, ICLK, QCLK and ICLKB used in the data input unit 301.

The parallel-to-serial conversion unit 303 selects the data DATA0, DATA1, DATA2 and DATA3 as the valid data during the enable periods of the clock signals ICLK, QCLK, ICLKB and QCLKB used in the parallel-to-serial conversion unit 303.

The four clock signals QCLKB, ICLK, QCLK and ICLKB used in the data input unit 301 have the 90-degree phase difference, and the four clock signals ICLK, QCLK, ICLKB and QCLKB used in the parallel-to-serial conversion unit 303 also have the 90-degree phase difference. Furthermore, the four clock signals ICLK, QCLK, ICLKB and QCLKB used in the parallel-to-serial conversion unit 303 have the 90-degree phase difference from the clock signals QCLKB, ICLK, QCLK and ICLKB used in the data input unit 301, respectively. This has the following meaning.

For example, this means the phase difference between the clock signal QCLKB of the data input unit 301, which is used to process the data DATA0 input through the first path, and the clock signal ICLK of the parallel-to-serial conversion unit 303, which is used to process the valid data D0/D0B of the data input unit 301, is 90 degrees.

Although described later, the above-described clock signals are used for serially outputting the plurality of parallel data DATA0, DATA1, DATA2 and DATA3 by using only the clock signals, without processing the clock signals into a pulse form having a narrow enable period. That is, the data input unit 301 and the parallel-to-serial conversion unit 303 use their clock signals to select the data DATA0, DATA1, DATA2 and DATA3 as the valid data and output the selected data as the output data OUT.

The data input unit 301 includes a plurality of input blocks 301A, 301B, 301C and 301D. The plurality of input blocks 301A, 301B, 301C and 301D include NAND gates 305, 307, 309 and 311 configured to respectively receive the data DATA0, DATA1, DATA2 and DATA3 and the clock signals QCLKB, ICLK, QCLK and ICLKB having different phases, and inverters 313, 315, 317 and 319 configured to respectively invert output signals of the NAND gates 305, 307, 309 and 311. Thus, the data input unit 301 receives the data DATA0, DATA1, DATA2 and DATA3 as the valid data D0/D0B, D1/D1B, D2/D2B and D3/D3B. At this point, the signals D0B, D1B, D2B and D3B that do not pass through the inverters 313, 315, 317 and 319 are also output, and they are used in the parallel-to-serial conversion unit 303, which will be described later.

The term "valid" means that only data input at the enable periods of the clock signals QCLKB, ICLK, QCLK and ICLKB having the different phases are selected among the data DATA0, DATA1, DATA2 and DATA3 successively input to the data input unit 301.

For example, the logic level of the data or input at the enable periods of the clock signals having the different phases are inverted or not inverted. However, the data input at periods other than the enable periods of the clock signals having the different phases have constant values, regardless of the logic level of the data.

Assuming that the enable periods of the four clock signals QCLKB, ICLK, QCLK and ICLKB having the different phases are high level periods, the valid data D0, D1, D2 and D3 where the data DATA0, DATA1, DATA2 and DATA3 have the same logic level are output during the high level periods by the NAND gates 305, 307, 309 and 311 and the inverters 313, 315, 317 and 319. During the low level periods, the low level data are output by the NAND gates 305, 307, 309 and 311 and the inverters 313, 315, 317 and 319, regardless of the logic levels of the data DATA0, DATA1, DATA2 and DATA3.

In this case, the data D0B, D1B, D2B and D3B that do not pass through the inverters 313, 315, 317 and 319 are also output and they are used in the parallel-to-serial conversion unit 303, which will be described later. Such data D0B, D1B, D2B and D3B have different logic levels from the above-described case, but they are also the valid data.

That is, the data input unit 301 receives the data DATA0, DATA1, DATA2 and DATA3 as the valid data D0/D0B, D1/D1B, D2/D2B and D3/D3B during the enable periods of the four clock signals QCLKB, ICLK, QCLK and ICLKB having the different phases.

The reception of the data DATA0, DATA1, DATA2 as the valid data D0/D0B, D1/D1B, D2/D2B and D3/D3B during the enable periods of the four clock signals QCLKB, ICLK, QCLK and ICLKB having the different phases are done for selecting the data DATA0, DATA1, DATA2 and DATA3 by using the constant phase difference from the clock signals ICLK, QCLK, ICLKB and QCLKB used in the parallel-to-serial conversion unit 303, and serially outputting the selected data.

The parallel-to-serial conversion unit 303 includes a node A terminated to a first level, and a plurality of first drivers 327 to 330 for driving the node A to a second level in response to the valid data D0, D1, D2 and D3 of the data input unit 301 and the clock signals ICLK, QCLK, ICLKB and QCLKB. The data DATA0, DATA1, DATA2 and DATA3 are serially output in response to the logic level of the node A.

As described above, the clock signals ICLK, QCLK, ICLKB and QCLKB used in the parallel-to-serial conversion unit 303 has a 90-degree phase difference from the clock signals QCLKB, ICLK, QCLK and ICLKB used in the data input unit 301, respectively.

The driver 327 includes a transistor T1 and a transistor T2 connected in series. The transistor T1 receives the valid data D0 of the data input unit 301 and the transistor T2 receives the clock signal ICLK used in the parallel-to-serial conversion unit 303. The driver 328 includes a transistor T3 and a transistor T4 connected in series. The transistor T3 receives the valid data D1 of the data input unit 301 and the transistor T4 receives the clock signal QCLK used in the parallel-to-serial conversion unit 303. The driver 329 includes a transistor T5 and a transistor T6 connected in series. The transistor T5 receives the valid data D2 of the data input unit 301 and the transistor T6 receives the clock signal ICLKB used in the parallel-to-serial conversion unit 303. The driver 330 includes a transistor T7 and a transistor T8 connected in series. The transistor T7 receives the valid data D3 of the data input unit 301 and the transistor T8 receives the clock signal QCLKB used in the parallel-to-serial conversion unit 303.

The first drivers 327 to 330 select the data DATA0, DATA1, DATA2 and DATA3 through the transistors T1 to T8 receiving the valid data D0, D1, D2 and D3 and the clock signals ICLK, QCLK, ICLKB and QCLKB having the 90-degree phase difference. In this case, since the NMOS transistors T1/T2, T3/T4, T5/T6 and T7/T8 are connected in series, the output data OUT can be output when they are turned on together.

During the enable periods of the clock signals ICLK, QCLK, ICLKB and QCLKB used in the parallel-to-serial conversion unit 303, the first drivers 327 to 330 select the data DATA0, DATA1, DATA2 and DATA3 as the valid data having the 90-degree phase difference from the valid data D0, D1, D2 and D3 input to the data input unit 301.

The meaning of "valid" is the same as that described above in the data input unit 301.

The first drivers 327 to 330 do not directly receive the data DATA0, DATA1, DATA2 and DATA3, but receive the valid data D0, D1, D2 and D3 of the data input unit 301. However, the valid data D0, D1, D2 and D3 of the data input unit 301 are also derived from the data DATA0, DATA1, DATA2 and DATA3, and the clock signals ICLK, QCLK, ICLKB and QCLKB having the 90-degree phase difference from the clock signals QCLKB, ICLK, QCLK and ICLKB of the data input unit 301 are used. Therefore, it can be considered that the parallel-to-serial conversion unit 303 selects the data DATA0, DATA1, DATA2 and DATA3 as the valid data D0, D1, D2 and D3.

The parallel data DATA0, DATA1, DATA2 and DATA3 are input as the valid data D0, D1, D2 and D3 through the data input unit 301 and are then output as the output data OUT of the parallel-to-serial conversion unit 303 only during the periods where they are selected as the valid data by the parallel-to-serial conversion unit 303.

Figure 5:
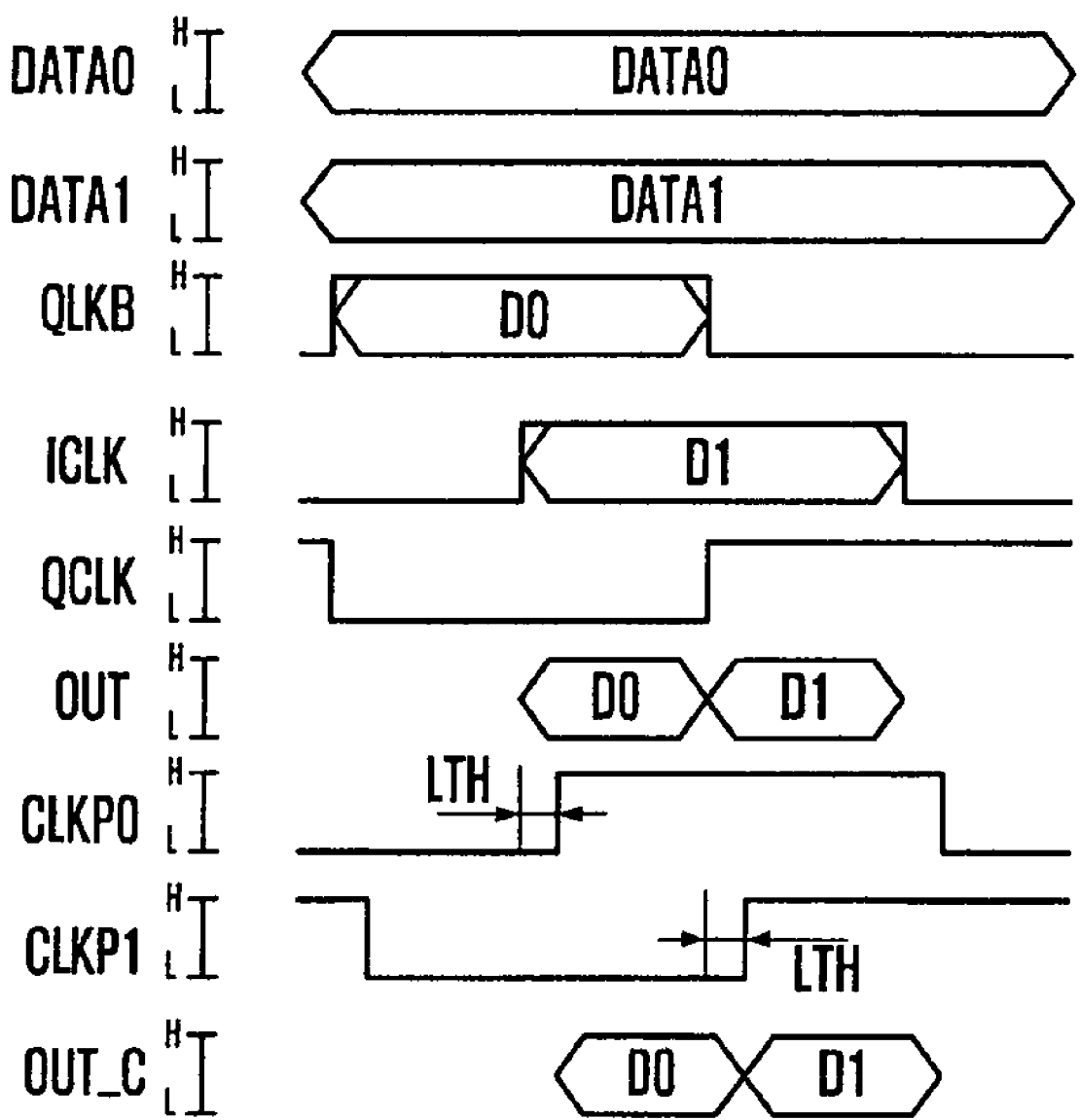
FIG. 5 illustrates the selection of valid data.

The selection of the valid data is exemplarily illustrated in FIG. 5. For example, the data input unit 301 selects the data DATA0 as the valid data D0 by the clock signal QCLKB, and the parallel-to-serial conversion unit 303 selects the data DATA0 as the valid data D0 by the clock signal ICLK. As illustrated, the data have low level at periods other than the period where the data is selected as the valid data, regardless of the logic level of the data, and it does not affect the driving of the first drivers 327 to 330. The clock signals CLKP0 and CLKP1 will be described later with reference to FIG. 6.

When the data DATA0 is at a high level, the NMOS transistors T1 to T8 are turned on in one of the first drivers 327 to 330 at the common period of the valid data D0, D1, D2 and D3 of the data input unit 301 and the valid data of the parallel-to-serial conversion unit 303 because the NMOS transistors T1 to T8 of the first drivers 327 to 330 are connected in series.

That is, the data DATA0, DATA1, DATA2 and DATA3 are output as the output data OUT at the common enable period of the clock signals QCLKB, ICLK, QCLK and ICLKB used in the data input unit 301 and the clock signals ICLK, QCLK, ICLKB and QCLKB used in the parallel-to-serial conversion unit 303. In addition, the NMOS transistors in only one of the first drivers 327 to 330 are turned on together to select the data DATA0, DATA1, DATA2 and DATA3. Therefore, the output data OUT are output without overlap.

When the output signal of the low level is not output from the first drivers 327 to 330, the node A is terminated to a high level by the power supply voltage VDD. Therefore, the data DAT0, DATA1, DATA2 and DATA3 are at the low level, the first drivers 327 to 330 are not enabled and the node A is terminated to a high level. Due to the inverter 321, the logic level of the output data OUT becomes equal to the logic levels of the data DATA0, DATA1, DATA2 and DATA3.

When the data DATA0, DATA1, DATA2 and DATA3 are at a high level, one of the first drivers 327 to 330 is enabled and the node A is terminated to a low level. Due to the inverter 321, the logic level of the output data OUT becomes equal to the logic levels of the data DATA0, DATA1, DATA2 and DATA3.

That is, the inverter 321 serially outputs the data DATA0, DATA1, DATA2 and DATA3 in response to the logic level of the node A. The inverter 321 functions to make the output data OUT have the same logic level as the data DATA0, DATA1, DATA2 and DATA3.

According to the related art, the pulse signals generated by processing the clock signals having the different phases are used to select the data, determine the data width of the output data, and serially output the data. However, in accordance with the embodiment of the present invention, the clock signals having the different phases are used to select the data, determine the data width of the output data, and serially output the data.

In other words, the parallel-to-serial converter in accordance with the embodiment of the present invention can perform the function of the conventional parallel-to-serial converter by using only the clock signals having the different phases, without processing the clock signals into pulse signals having widths narrower than the widths of the high or low level periods of the clock signals having the different phases.

Figure 4:
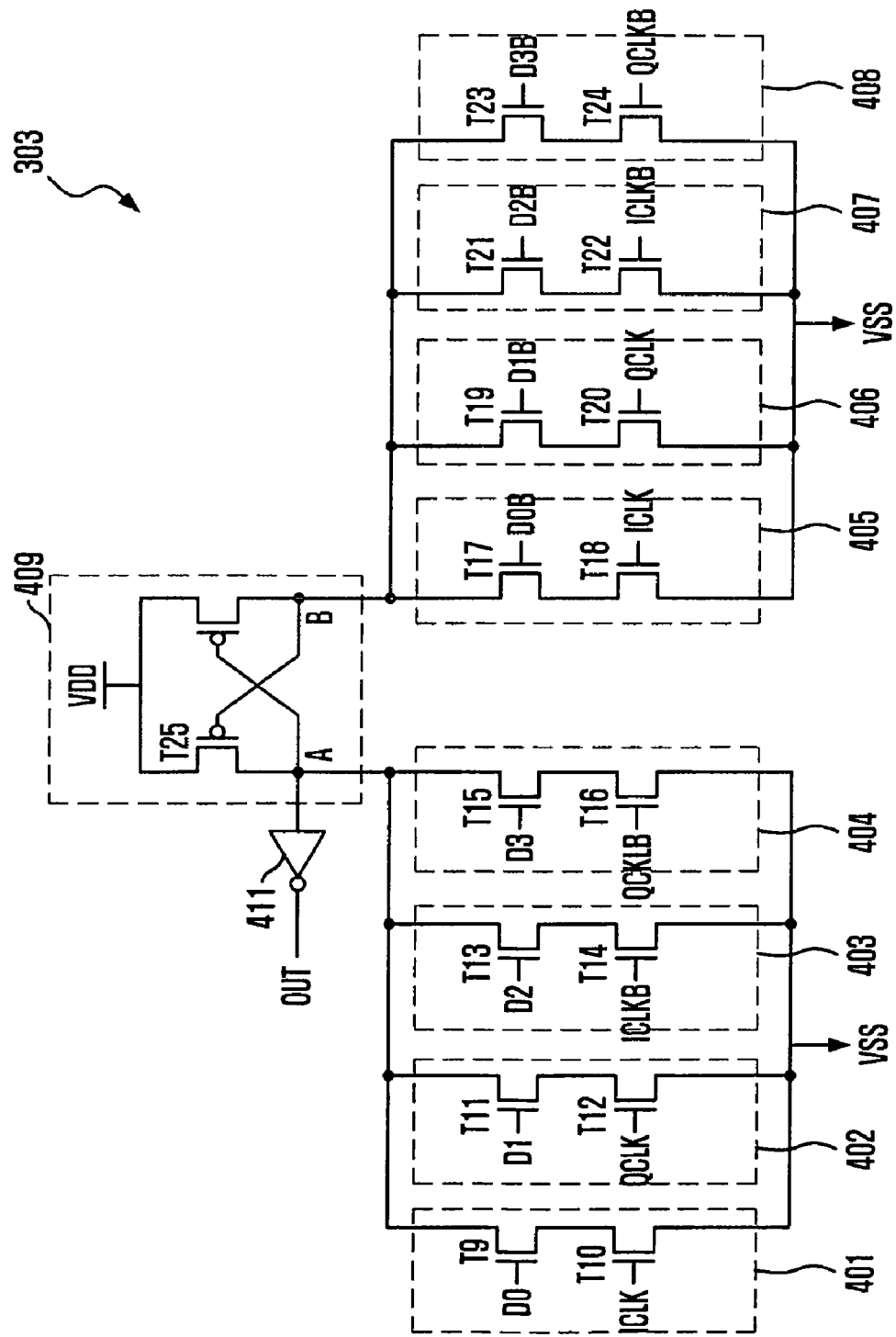
FIG. 4 is a circuit diagram of a parallel-to-serial conversion unit in accordance with another embodiment of the present invention.

FIG. 4 is a circuit diagram of a parallel-to-serial conversion unit 303 in accordance with another embodiment of the present invention.

Referring to FIG. 4, the parallel-to-serial conversion unit 303 includes a plurality of first drivers 401 to 404, a plurality of second drivers 405 to 408, and a third driver 409. The first drivers 401 to 404 drive a node A to a first level in response to the valid data D0, D1, D2 and D3 of the data input unit 301 and the clock signals ICLK, QCLK, ICLKB and QCLKB used in the parallel-to-serial conversion unit 303. The second drivers 405 to 408 drive a node B to a second level in response to the inverted valid data D0B, D1B, D2B and D3B of the data input unit 301 and the clock signals ICLK, QCLK, ICLKB and QCLKB used in the parallel-to-serial conversion unit 303. The third driver 409 drives the nodes A and B to different logic levels in response to the logic levels of the nodes A and B.

The parallel-to-serial conversion unit 303 of FIG. 4 differs from the parallel-to-serial conversion unit 303 of FIG. 3 in that the second drivers 405 to 408 are further provided. The data DATA0, DATA1, DATA2 and DATA3 are directly selected and output when they have low levels, instead of terminating the node A to a high level. Therefore, the parallel-to-serial conversion unit 303 receives the inverted valid data D0B, D1B, D2B and D3B, and generates the inverted valid data D0B, D1B, D2B and D3B of FIG. 3 so that they can be used in the embodiment of FIG. 4.

The driver 401 includes a transistor T9 and a transistor T10 connected in series. The transistor T9 receives the valid data D0 of the data input unit 301 and the transistor T10 receives the clock signal ICLK used in the parallel-to-serial conversion unit 303. The driver 402 includes a transistor T11 and a transistor T12 connected in series. The transistor T11 receives the valid data D1 of the data input unit 301 and the transistor T12 receives the clock signal QCLK used in the parallel-to-serial conversion unit 303. The driver 403 includes a transistor T13 and a transistor T14 connected in series. The transistor T13 receives the valid data D2 of the data input unit 301 and the transistor T14 receives the clock signal ICLKB used in the parallel-to-serial conversion unit 303. The driver 404 includes a transistor T15 and a transistor T16 connected in series. The transistor T15 receives the valid data D3 of the data input unit 301 and the transistor T16 receives the clock signal QCLKB used in the parallel-to-serial conversion unit 303. Furthermore, the driver 405 includes a transistor T17 and a transistor T18 connected in series. The transistor T17 receives the inverted valid data D0B of the data input unit 301 and the transistor T18 receives the clock signal ICLK used in the parallel-to-serial conversion unit 303. The driver 406 includes a transistor T19 and a transistor T20 connected in series. The transistor T19 receives the inverted valid data D1B of the data input unit 301 and the transistor T20 receives the clock signal QCLK used in the parallel-to-serial conversion unit 303. The driver 407 includes a transistor T21 and a transistor T22 connected in series. The transistor T21 receives the inverted valid data D2B of the data input unit 301 and the transistor T22 receives the clock signal ICLKB used in the parallel-to-serial conversion unit 303. The driver 408 includes a transistor T23 and a transistor T24 connected in series. The transistor T23 receives the inverted valid data D3B of the data input unit 301 and the transistor T24 receives the clock signal QCLKB used in the parallel-to-serial conversion unit 303.

Unlike the parallel-to-serial conversion unit 303 of FIG. 3, the node A becomes a low level when the data are high level, and the node B becomes a low level when the data are low level. When the node A is at a low level, the output data OUT becomes a high level due to the inverter 411. When the node B is at a low level, a PMOS transistor T25 of the third driver 409 is turned on. Therefore, the PMOS transistor T25 passes the power supply voltage so that the output data OUT becomes a low level due to the inverter 411. That is, the third driver 409 drives the node A to a high level in response to the low level of the node B.

The inverter 411 functions to equalize the output data OUT to the logic levels of the data DATA0, DATA1, DATA2 and DATA3.

Figure 6:
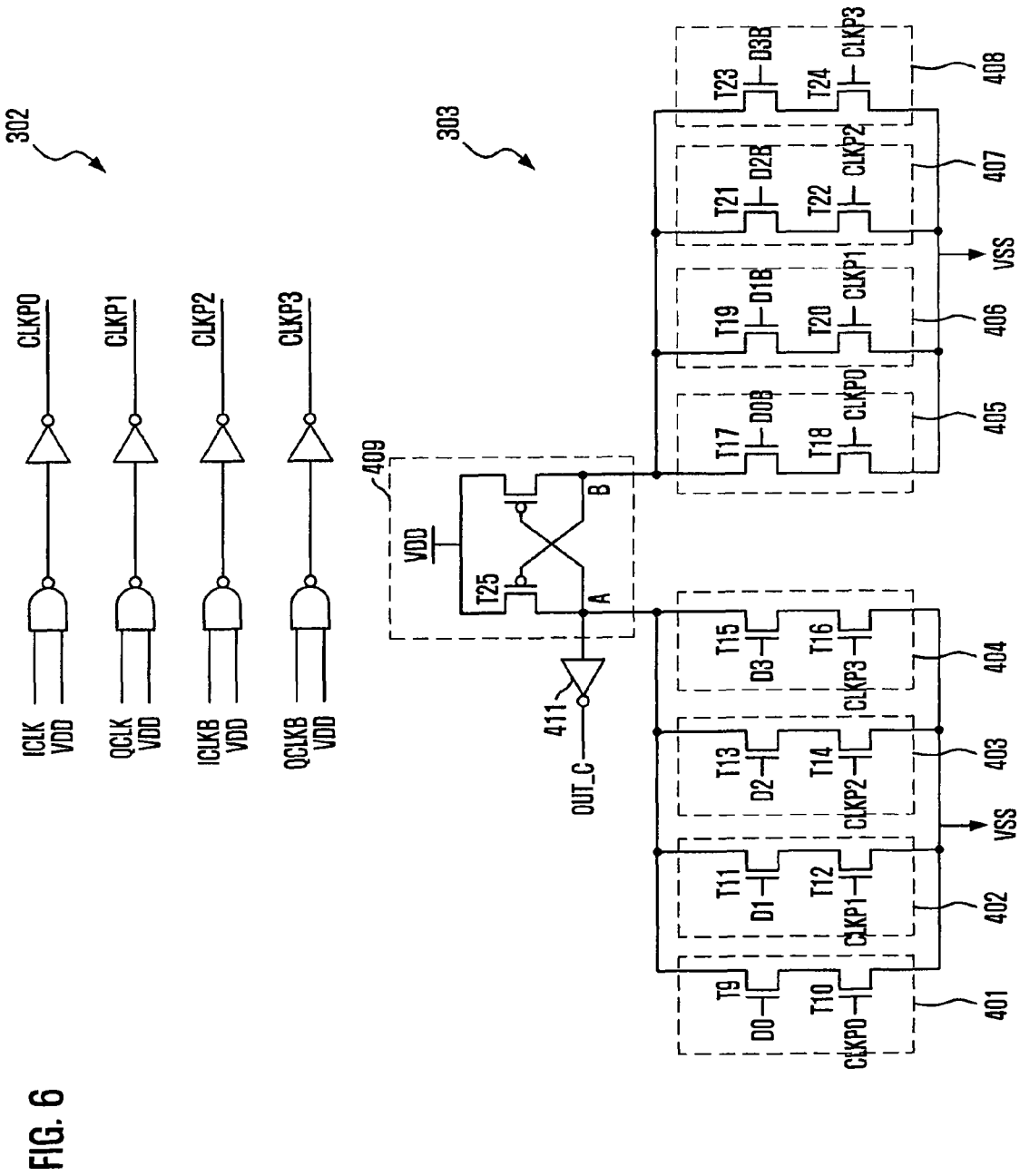
FIG. 6 is circuit diagram illustrating the parallel-to-serial conversion unit of FIG. 4 and a delay unit added thereto.

FIG. 6 is circuit diagram illustrating the parallel-to-serial conversion unit 303 of FIG. 4 and a delay unit 302 added thereto.

The delay unit 302 includes NAND gates and inverters for receiving the four clock signals ICLK, QCLK, ICLKB and QCLKB used in the parallel-to-serial conversion unit 303 of FIG. 4 and the power supply voltage VDD to delay the four clock signals ICLK, QCLK, ICLKB and QCLKB by a predetermined amount. The delay unit 302 ensures a margin between the clock signals QCLKB, ICLK, QCLK and ICLKB used in the data input unit 301 and the clock signals ICLK, QCLK, ICLKB and QCLKB used in the parallel-to-serial conversion unit 303.

In FIG. 5, the data input unit 301 selects the data DATA0 as the valid data D0 by the clock signal QCLKB, and the parallel-to-serial conversion unit 303 selects the data DATA0 as the valid data by the clock signal ICLK. The data input unit 301 selects the data DATA1 as the valid data D1 by the clock signal ICLK, and the parallel-to-serial conversion unit 303 selects the data DATA1 as the valid data by the clock signal QCLK.

In this case, the parallel-to-serial conversion unit 303 uses the clock signals CLKP0, CLKP1, CLKP2 and CLKP3 generated by delaying the four clock signals ICLK, QCLK, ICLKB and QCLKB used in the parallel-to-serial conversion unit 303 of FIG. 4 by a predetermined amount. That is, ICLK, QCLK, ICLKB, and QCLKB correspond to CLKP0, CLKP1, CLKP2, and CLKP3, respectively. Due to the delayed clock signals CLKP0, CLKP1, CLKP2 and CLKP3, a predetermined period LTH corresponding to the predetermined amount is formed between the data selected as the valid data. For example, the predetermined period LTH extends from the falling edge of the clock signal QCLKB of the data input unit 301 to the rising edge of the clock signal CLKP1 of the parallel-to-serial conversion unit 303.

The predetermined period LTH is a period where all the transistors of the parallel-to-serial conversion unit 303 are turned off, and the parallel-to-serial conversion unit 303 outputs the previous data as the output data OUT_C. That is, in this case, the data DATA0 is output as the output data OUT_C.

The delay unit 302 ensures the margin between the data when the data DATA0, DATA1, DATA2 and DATA3 are output as the output data OUT_C. Thus, it is possible to prevent the data DATA0, DATA1, DATA2 and DATA3 from colliding as the output data OUT_C, which is caused by the overlap of the data. Therefore, the performance of the device can be further improved. Any predetermined amount is enough if it can prevent the collision of the data DATA0, DATA1, DATA2 and DATA3 as the output data OUT_C, which is caused by the overlap of the data.

Figure 7:
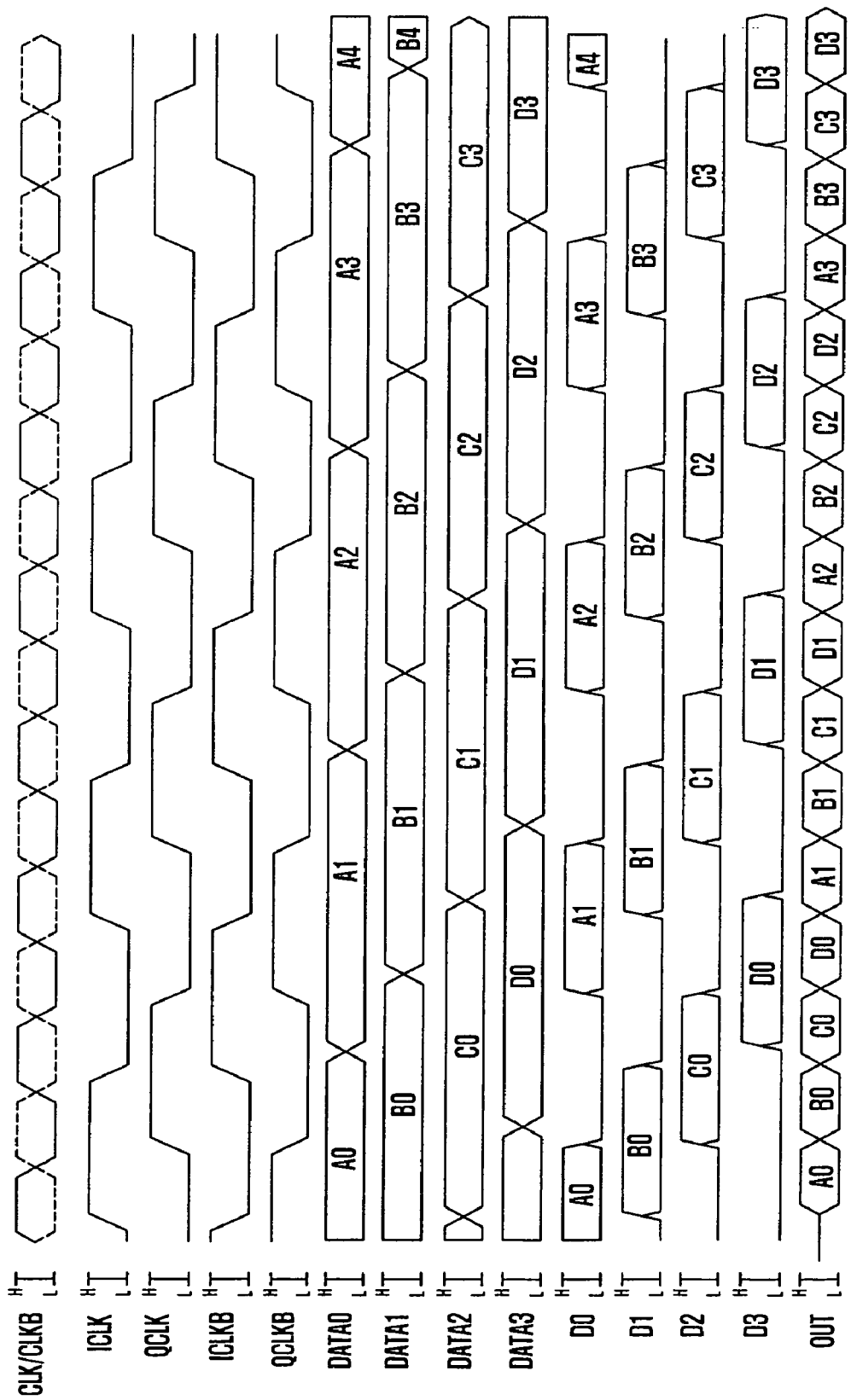
FIG. 7 is a timing diagram illustrating the overall operation of the parallel-to-serial converter in accordance with the embodiment of the present invention.

FIG. 7 is a timing diagram illustrating the overall operation of the parallel-to-serial converter in accordance with the embodiment of the present invention.

The clock signal ICLK is used when the data input unit 301 processes the second data DATA1, and the clock signal QCLK having 90-degree lagging phase is used when the parallel-to-serial conversion unit 303 processes the second valid data D1. The clock signal QCLK is used when the data input unit 301 processes the third data DATA2, and the clock signal ICLKB having 90-degree lagging phase is used when the parallel-to-serial conversion unit 303 processes the third valid data D2. The remaining two data DATA0 and DATA3 are processed using the remaining clock signals in the above manner.

In the case of the second data DATA1, since the enable periods of the four clock signals QCLKB, ICLK, QCLK and ICLKB having the different phases, which are used in the data input unit 301, are selected as the high level periods, the data input unit 301 outputs the second valid data D1 from the second data DATA1 at the high level period of the clock signal ICLK.

Also, the enable periods of the four clock signal ICLK, QCLK, ICLKB and QCLKB having the different phases, which are used in the parallel-to-serial conversion unit 303, are selected as the high level periods of the first drivers 327 to 330. Therefore, the data are output as the output data B0 as long as the high level period of the clock signal QCLK during the period of the second valid data D1.

Figure 8:
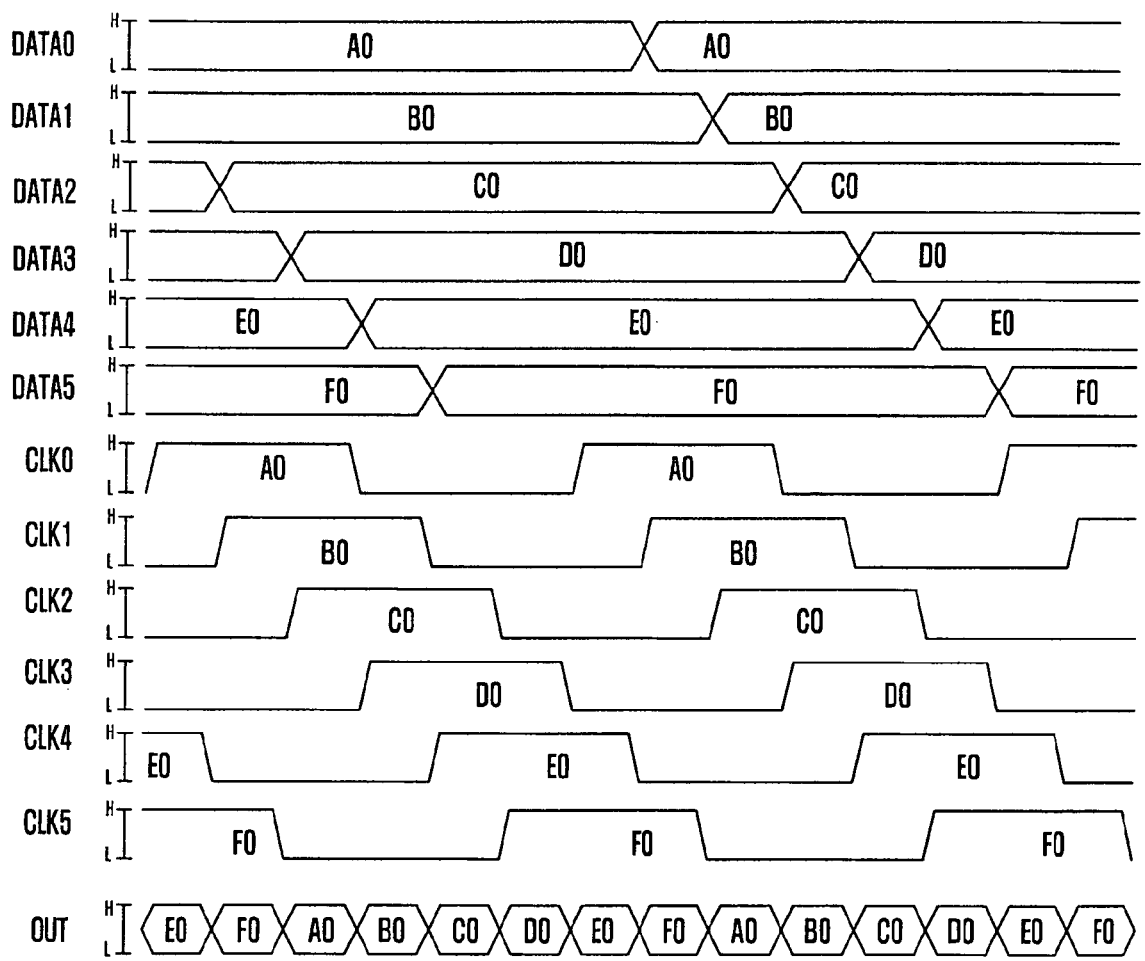
FIG. 8 is a timing diagram of the clock signals in accordance with the embodiment of the present invention.

FIG. 8 is a timing diagram of the clock signals in accordance with the embodiment of the present invention.

Specifically, FIG. 8 illustrates how a 6:1 parallel-to-serial converter selects and outputs data by using clock signals CLK0 to CLK5 having different phases. In the embodiment of FIG. 3, since the parallel data DATA0, DATA1, DATA2 and DATA3 are input through the four paths, the data input unit 301 uses the clock signals QCLKB, ICLK, QCLK and ICLKB having the 90-degree phase difference, and the parallel-to-serial conversion unit 303 uses the clock signals ICLK, QCLK, ICLKB and QCLKB having the 90-degree phase difference from the clock signals QCLKB, ICLK, QCLK and ICLKB that are used in the data input unit 301.

However, the present invention can also be applied to a case where a plurality of parallel data are input through a plurality of paths. For example, when a plurality of parallel data DATA0 to DATA5 are input through six paths, clock signals CLK0 to CLK5 having a 60-degree phase difference may be used as illustrated in FIG. 8.

The six clock signals CLK0 to CLK5 having the different phases have a 60-degree phase difference. The high level period is set as the enable period, and the clock signals CLK0 to CLK5 to be used in the parallel-to-serial conversion unit 303 correspond to the clock signals CLK0 to CLK5 having a 120-degree phase difference from the clock signals CLK0 to CLK5 that are used in the data input unit 301. In this way, the data can be selected and output.

That is, if the clock signals CLK0, CLK1, CLK2, CLK3, CLK4, and CLK5 correspond to the clock signals CLK2, CLK3, CLK4, CLK5, CLK0, and CLK1, respectively, the 6:1 parallel-to-serial converter can select and output the output data A0, B0, C0, D0, E0 and F0 by using only the clock signals CLK0 to CLK5 having the different phases.

Figure 9:
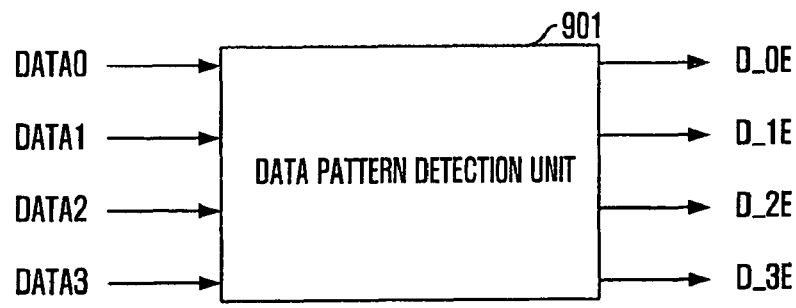
FIG. 9 is a block diagram of a parallel-to-serial converter in accordance with another embodiment of the present invention.
Figure 9:
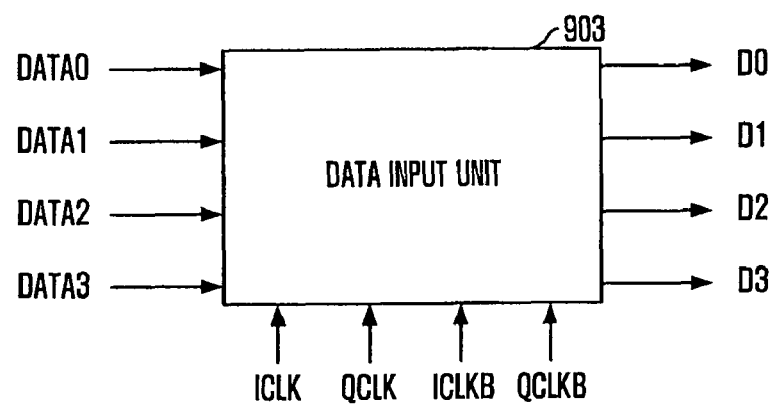
Figure 9:
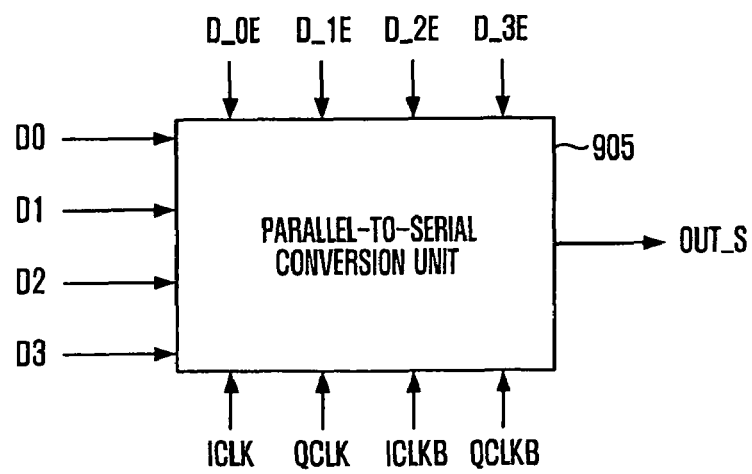

FIG. 9 is a block diagram of a parallel-to-serial converter in accordance with another embodiment of the present invention.

Specifically, FIG. 9 illustrates a 4:1 parallel-to-serial converter configured to receive a plurality of data through four paths.

Referring to FIG. 9, the parallel-to-serial converter includes a data input unit 903, a parallel-to-serial conversion unit 905, and a data pattern detection unit 901. The data input unit 903 receives a plurality of parallel data DATA0, DATA1, DATA2 and DATA3 through four paths as valid data at enable periods of four clock signals QCLKB, ICLK, QCLK and ICLKB having different phases. The parallel-to-serial conversion unit 905 sequentially selects the output signals of the data input unit 903 to output serial data OUT_S at enable periods of the four clock signals ICLK, QCLK, ICLKB and QCLKB having a 90-degree phase difference from the four clock signals QCLKB, ICLK, QCLK and ICLKB used in the data input unit 903, and adjusts the drivability in outputting the serial data OUT_S in response to drivability control signals D_0E, D_1E, D_2E and D_3E. The data pattern detection unit 901 enables the drivability control signals D_0E, D_1E, D_2E and D_3E when the serial data OUT_S maintain the same logic level during more than a predetermined period and then changes to an opposite logic level.

The parallel-to-serial converter of FIG. 9 can improve jitter characteristics. If the data continuously maintain the same logic levels and then change to the opposite logic level, their pull swing is difficult, causing jitters. The parallel-to-serial converter of FIG. 9 includes the data pattern detection unit 901 to increase the drivability when the jitters are generated. Therefore, the jitter characteristics are improved.

When the serial data OUT_S continuously maintain the same logic level and then change to the opposite logic level, the data pattern detection unit 901 detects the logic level transition and enables the drivability control signals D_0E, D_1E, D_2E and D_3E. In outputting the serial data OUT_S in the above case, the enabled drivability control signals D_0E, D_1E, D_2E and D_3E increase the drivability of the parallel-to-serial conversion unit 905, thus decreasing the jitters. At this point, the drivability control signals D_0E, D_1E, D_2E and D_3E are enabled when the serial data OUT_S changing to the opposite logic levels are output. Therefore, the swing widths of the serial data OUT_S are increased to the maximum, thereby more efficiently eliminating the jitters caused by the limitation of the swing widths.

Meanwhile, when the serial data OUT_S are continuously at the same level, jitters may be increased if the serial data OUT_S are output at the increased drivability. In this case, the data pattern detection unit 901 disables the drivability control signals D_0E, D_1E, D_2E and D_3E.

The data pattern detection unit 901 compares the logic levels of the previously output serial data OUT_S and stores the comparison results. Then, the data pattern detection unit 901 detects the data patterns by comparing the comparison results with the serial data OUT_S to be output. If the enabled drivability control signals D_0E, D_1E, D_2E and D_3E are input to the parallel-to-serial conversion unit 905, the parallel-to-serial conversion unit 905 increases the drivability and outputs the serial data OUT_S at the increased drivability.

Figure 11:
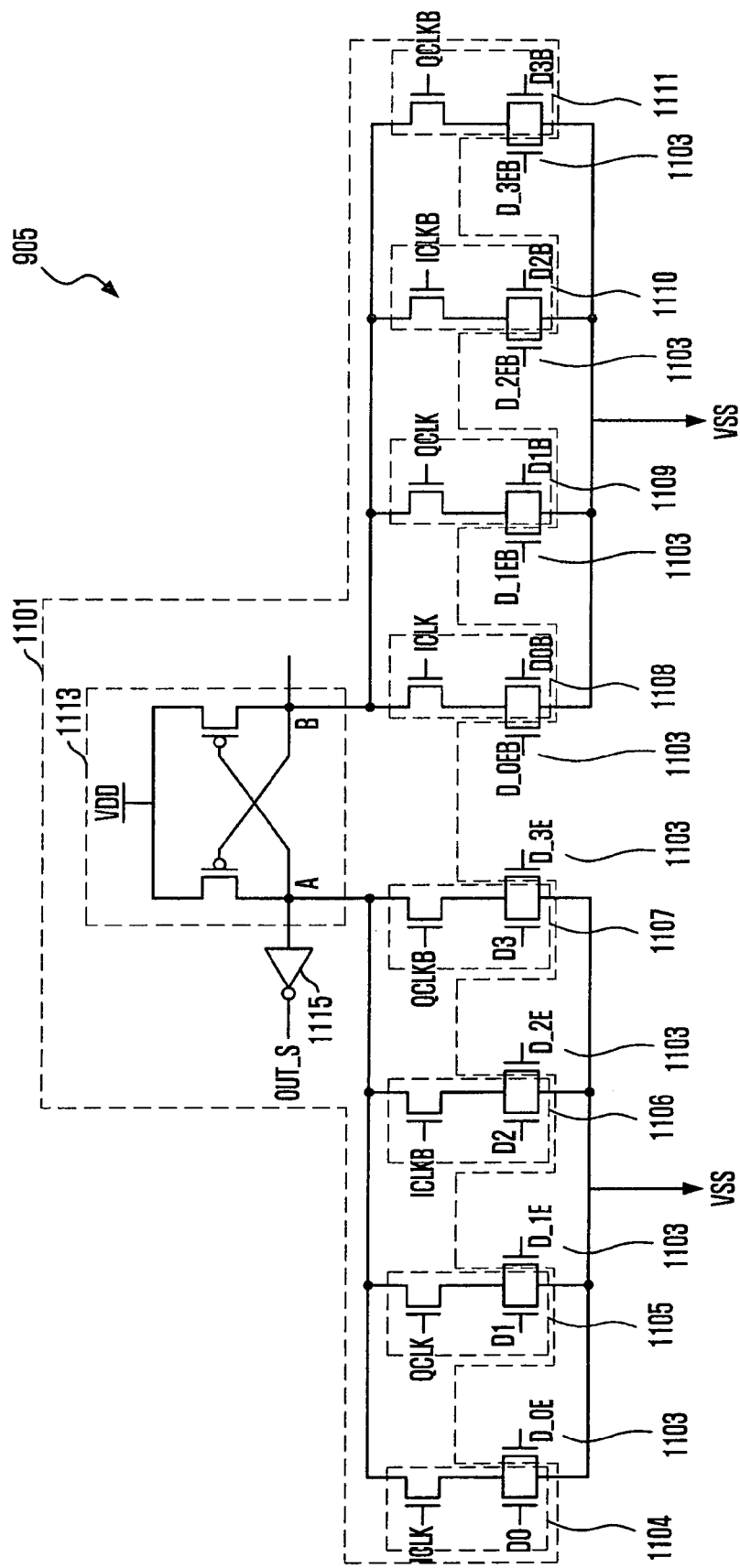
FIG. 11 is a circuit diagram of a parallel-to-serial conversion unit of FIG. 9.

The structure of the parallel-to-serial converter 905 of FIG. 9 is similar to that of the parallel-to-serial conversion unit 303 of FIG. 4. Like the parallel-to-serial conversion unit 303 of FIG. 4, the parallel-to-serial conversion unit 905 of FIG. 9 sequentially selects the output signals of the data input unit 903 and outputs the serial data OUT_S. However, the parallel-to-serial conversion unit 905 of FIG. 9 includes a drivability control unit 1103 as shown in FIG. 11 for increasing the drivability of the parallel-to-serial conversion unit 905 in response to the drivability control signals D_0E, D_1E, D_2E and D_3E. In outputting the serial data OUT_S, the drivability control unit 1103 increases the drivability of the parallel-to-serial conversion unit 905 by increasing an amount of current flowing through the parallel-to-serial conversion unit 905.

Meanwhile, the structure and operation of the data input unit 903 are the same as those of the data input unit 301 of FIG. 9.

Figure 10:
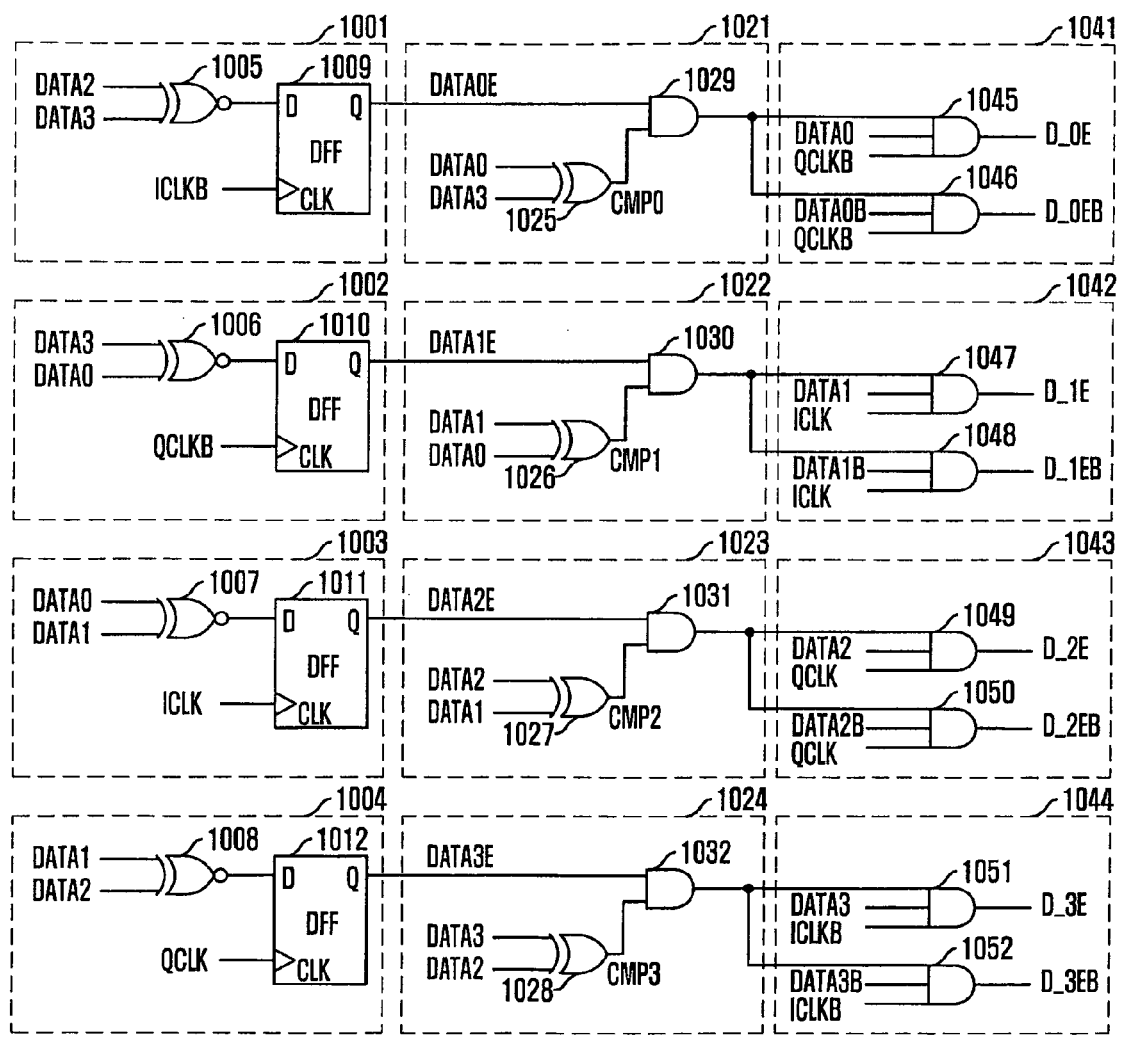
FIG. 10 is a circuit diagram of a data pattern detection unit of FIG. 9.

FIG. 10 is a circuit diagram of the data pattern detection unit 901 of FIG. 9.

Referring to FIG. 10, the data pattern detection unit 901 includes first comparison units 1001 to 1004, second comparison units 1021 to 1024, and pulse width control units 1041 to 1044. The first comparison units 1001 to 1004 compare the logic levels of the serial data OUT_S output from during a predetermined period to output the comparison results. The second comparison units 1021 to 1024 compare the comparison results of the first comparison units 1001 to 1004 with logic levels of the serial data OUT_S, which will be output after the predetermined period, and enables the drivability control signals D_0E, D_1E, D_2E and D_3E when the serial data OUT_S have the opposite logic levels to those of the serial data OUT_S output during the predetermined period. The pulse width control units 1041 to 1044 control the widths of the enable periods of the drivability control signals D_0E, D_1E, D_2E and D_3E.

The first comparison units 1001 to 1004 compare the serial data OUT_S output during the predetermined period, and maintain the comparison results until the outputting of the serial data OUT_S to be output after the predetermined period is completed.

For convenience, it is assumed that the predetermined period is a 2-bit period of the serial data OUT_S. The 2-bit period means two serial data OUT_S output successively immediately before the serial data OUT_S to be output. The predetermined period may be different according to the design of the data pattern detection unit 901.

Since the parallel-to-serial converter in accordance with the embodiment of the present invention is the 4:1 parallel-to-serial converter and compares the serial data OUT_S of the 2-bit period, it includes four first comparison units 1001 to 1004, four second comparison units 1021 to 1024, and four pulse width control units 1041 to 1044.

The first comparison units 1001 to 1004 respectively include exclusive NOR gates 1005 to 1008 configured to receive two data successively output as the serial data OUT_S and compare if the received data have the same logic levels, and flop-flops 1009 to 1012 configured to maintain the comparison results DATA0E, DATA1E, DATA2E and DATA3E of the exclusive NOR gates 1005 to 1008 while data to be output after the 2-bit period are output. As described above with reference to FIG. 9, the reason why the flop-flops 1009 to 1021 are used to maintain the comparison results DATA0E, DATA1E, DATA2E and DATA3E is for enabling the drivability control signals D_0E, D_1E, D_2E and D_3E while the data to be output after the 2-bit period are output as the serial data OUT_S.

For fully understanding the present invention, a case where the serial data OUT_S are output with the same levels during the 2-bit period and then output with the opposite levels will be exemplarily described below. If two data DATA2 and DATA3 to be successively output as the serial data OUT_S by the first comparison unit 1001 have the same logic level, the comparison result of the exclusive NOR gate 1005 becomes a high level signal. The flip-flop 1009 triggers the comparison result at a rising edge of the clock signal ICLKB and outputs a comparison result until a next rising edge of the clock signal ICLKB.

The comparison result DATA0E of the first comparison unit 1001 is input to the second comparison unit 1021. The second comparison units 1021 to 1024 respectively include exclusive OR gates 1025 to 1028 configured to compare one of two data to be output as the serial data OUT_S with data to be output after the 2-bit period, and AND gates 1029 to 1032 configured to compare comparison results CMP0, CMP1, CMP2 and CMP3 of the exclusive OR gates 1025 to 1028 with the comparison results DATA0E, DATA1E, DATA2E and DATAE3 of the first comparison units 1001 to 1004.

In the above example, if the logic level of the data DATA0 to be output after the 2-bit period is different from logic levels of the two data DATA2 and DATA3 to be output as the serial data OUT_S, the comparison result CMP0 of the exclusive OR gate 1025 becomes a high level signal. Since the comparison result DATA0E of the first comparison unit 1001 is a high level and the comparison result CMP0 of the exclusive OR gate 1025 is a high level, the drivability control signal D_0E output from the AND gate 1029 becomes a high level. That is, in the above example, the data pattern detection unit 901 outputs the drivability control signal D_0E that is enabled to a high level.

If the logic level of the data DATA0 to be output after the 2-bit period is identical to logic levels of the two data DATA2 and DATA3 to be output as the serial data OUT_S, the comparison result CMP0 of the exclusive OR gate 1025 becomes a low level signal. Therefore, the drivability control signal D_0E is disabled to a low level by the AND gate 1029.

In addition, if the logic levels of the two data DATA2 and DATA3 to be output are different from each other, the comparison result DATA0E of the first comparison unit 1001 is a low level, the drivability control signal D_0E is disabled to a low level by the AND gate 1029.

The pulse width control units 1041 to 1044 control the widths of the enable periods of the drivability control signals D_0E, D_1E, D_2E and D_3E so that the drivability control signals D_0E, D_1E, D_2E and D_3E can be enabled only when outputting the serial data OUT_S, which are necessary to be output with the increased drivability by increasing the drivability of the parallel-to-serial conversion unit 905. The pulse width control units 1041 to 1044 receive the clock signals QCLKB, ICLK, QCLK and ICLKB, which are used by the data input unit 903 when the plurality of data DATA0, DATA1, DATA2 and DATA3 are input as the valid data D0, D1, D2 and D3, through the AND gates 1045 to 1052, and control the widths of the enable periods of the drivability control signals D_0E, D_1E, D_2E and D_3E.

In the above case, when the data DATA0 is output as the serial data OUT_S, it is input to the data input unit 903 as the valid clock D0 by the clock signal QCLKB. Thus, the pulse width control unit 1041 also uses the clock signal QCLKB, which is used in the data input unit 903. The data DATA0 to be used as the serial data OUT_S and the inverted data DATA0B are received through the AND gates 1045 and 1046 in order for outputting low level data in relation to the parallel-to-serial conversion unit 905. The reason is the same as the case described above with reference to FIG. 4, where the parallel-to-serial conversion unit 303 includes the second drivers 405 to 408 for directly selecting the data DATA0, DATA1, DATA2 and DATA3 when their logic levels are low levels.

Meanwhile, the inverted drivability control signals D_0EB, D_1EB, D_2EB and D_3EB are used for the case where the data DATA0, DATA1, DATA2 and DATA3 have the low level.

The structures and operations of the first comparison units 1002, 1003 and 1004, the second comparison units 1022, 1023 and 1024, and the pulse width control units 1042, 1043 and 1044 are identical to those of the first comparison unit 1001, the second comparison unit 1021, and the pulse width control unit 1041.

FIG. 11 is a circuit diagram of the parallel-to-serial conversion unit 905 of FIG. 9.

Referring to FIG. 9, the parallel-to-serial conversion unit 905 includes a signal selection unit 1101 and drivability control unit 1103. The signal selection unit 1101 includes a plurality of first selectors 1104 to 1107, a plurality of second selectors 1108 to 1111, a driver 1113 and an inverter 1115. The first selectors 1104 to 1107 respectively include a first transistor configured to receive one of the valid data D0, D1, D2 and D3 of the data input unit 903, and a second transistor connected in series to the first transistor to receive one of the clock signals ICLK, QCLK, ICLKB and QCLKB. The first selectors 1104 to 1107 drive a node A to a first level in response to one of the valid data D0, D1, D2 and D3 of the data input unit 903 and one of the clock signals ICLK, QCLK, ICLKB and QCLKB at the same time. The second selectors 1108 to 1111 respectively include a first transistor configured to receive one of the inverted valid data D0B, D1B, D2B and D3B of the data input unit 903, and a second transistor connected in series to the first transistor to receive one of the clock signals ICLK, QCLK, ICLKB and QCLKB. The second selectors 1108 to 1111 drive a node B to a second level in response to one of the inverted valid data D0B, D1B, D2B and D3B of the data input unit 903 and one of the clock signals ICLK, QCLK, ICLKB and QCLKB at the same time. The driver 1113 drives the nodes A and B to different logic levels in response to the logic levels of the nodes A and B. The drivability control unit 1103 includes transistors connected in parallel to one or more of the two transistors of the first and second selectors 1104 to 1107 and turned on in response to the drivability control signals D_0E, D_1E, D_2E and D_3E.

The signal selection unit 1101 has the same structure as the parallel-to-serial conversion unit 303 of FIG. 4. The parallel-to-serial conversion unit 905 of FIG. 9 further includes the drivability control unit 1103 in addition to the parallel-to-serial conversion unit 303 of FIG. 4.

When one of the data DATA0, DATA1, DATA2 and DATA3 is selected by one of the first selection units 1104 to 1107 and the second selection units 1108 to 1111 in response to the drivability control signals D_0E, D_1E, D_2E and D_3E, the transistor of the drivability control unit 1103 is turned on to form a current path in parallel to the selected first selection units 1104 to 1107 or second selection units 1108 to 1111. Therefore, the drivability control unit 1103 increases the drivability when the first selection units 1104 to 1107 and the second selection units 1108 to 1111 drive the node A and the node B to a low level.

At this point, as described above, the drivability control signals D_0E, D_1E, D_2E and D_3E are enabled at least while the serial data OUT_S are output. Therefore, the drivability control unit 1103 further forms a current path while one of the data DATA0, DADA1, DATA2 and DATA3 selected as the serial data OUT_S is output.

Meanwhile, the parallel-to-serial conversion unit 905 of FIG. 9 may include the delay unit 302 of FIG. 4.

Figure 12:
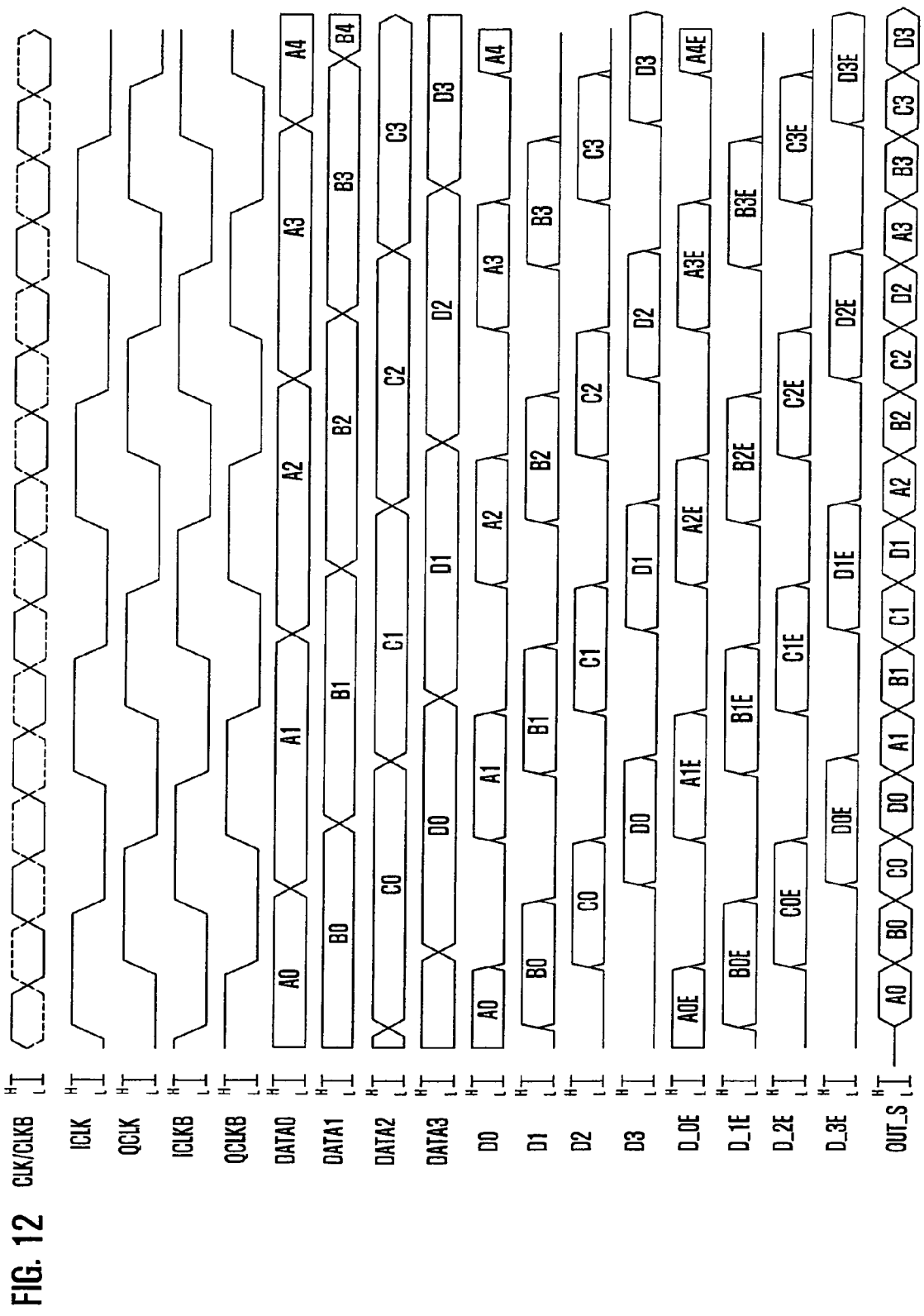
FIG. 12 is a timing diagram illustrating the operation of the parallel-to-serial converter of FIG. 9.

FIG. 12 is a timing diagram illustrating the operation of the parallel-to-serial converter of FIG. 9.

In FIG. 12, a part for the operation of the data pattern detection unit 901 is added in the timing diagram of FIG. 7.

The drivability control signals D_0E, D_1E, D_2E and D_3E are generated by the data pattern detection unit 901. Since the clock signals QCLKB, ICLK, QCLK and ICLKB used in the pulse width control units 1041 to 1044 are identical to the clock signals QCLKB, ICLK, QCLK and ICLKB used in the data input unit 903, the pulse widths of the enable periods of the drivability control signals D_0E, D_1E, D_2E and D_3E are identical to those of the valid data D0, D1, D2 and D3 of the data input unit 903.

Therefore, the pulse widths of the enable periods of the drivability control signals D_0E, D_1E, D_2E and D_3E correspond to the pulse widths of the serial data OUT_S, and the parallel-to-serial conversion unit 905 can increase the drivability while the serial data OUT_S are output.

As described above, the parallel-to-serial converter is capable of selecting and outputting data more correctly in a high frequency operation. More specifically, the data are selected and output by using only a plurality of clock signals having different phases, without processing the clock signals into a pulse form having a narrower width than that of the high or low level period of the clock signals.

Furthermore, the parallel-to-serial converter is capable of eliminating jitters caused by junction capacitances of pass gates because no pass gates are used.

While the present invention has been described with respect to the specific embodiments, it will be apparent to those skilled in the art that various changes and modifications may be made without departing from the spirit and scope of the invention as defined in the following claims.

What is claimed is:

1. A parallel-to-serial converter, comprising:
a data input unit having a plurality of input blocks configured to receive a plurality of parallel data by using a plurality of clock signals having different phases; and
a parallel-to-serial conversion unit having a plurality of first drivers configured to sequentially select and output an output signal of the data input unit by using a plurality of clock signals,
wherein each of the plurality of clock signals inputted to the plurality of input blocks has a predetermined constant phase difference from each of the plurality of clock signals inputted to the plurality of first drivers corresponding to the plurality of input blocks.

2. The parallel-to-serial converter as recited in claim 1, wherein the data input unit receives the plurality of data as valid data during enable periods of the clock signals used in the data input unit.

3. The parallel-to-serial converter as recited in claim 2, wherein the parallel-to-serial conversion unit selects the plurality of data as valid data during enable periods of the clock signals used in the parallel-to-serial conversion unit.

4. The parallel-to-serial converter as recited in claim 3, wherein the plurality of parallel data input to the data input unit are input as the valid data through the data input unit, and are output as valid output data of the parallel-to-serial conversion unit during only a period where the data are selected as the valid data through the parallel-to-serial conversion unit.

5. The parallel-to-serial converter as recited in claim 2, wherein the parallel-to-serial conversion unit comprises:
- a plurality of first drivers configured to drive a first node to a first level in response to the plurality of valid data and the clock signals used in the parallel-to-serial conversion unit;
- a plurality of second drivers configured to drive a second node to a second level in response to inverted valid data and the clock signals used in the parallel-to-serial conversion units; and
- a third driver configured to drive the first node and the second node to different logic levels in response to logic levels of the first node and the second node.

6. The parallel-to-serial converter as recited in claim 5, wherein each of the first drivers comprises a first transistor configured to receive one of the plurality of valid data, and a second transistor connected in series to the first transistor and configured to receive one of the clock signals used in the parallel-to-serial conversion unit, and each of the second drivers comprises a third transistor configured to receive one of the inverted valid data, and a fourth transistor connected in series to the third transistor and configured to receive one of the clock signals used in the parallel-to-serial conversion unit.

7. The parallel-to-serial converter as recited in claim 1, wherein the predetermined phase difference is adjusted to have a data width at which the output data of the parallel-to-serial converter are not overlapped.

8. The parallel-to-serial converter as recited in claim 1, further comprising a delay unit configured to delay the clock signals used in the parallel-to-serial conversion unit by a predetermined amount, thereby ensuring a margin between the output data by using output signals of the delay unit.

9. The parallel-to-serial converter as recited in claim 1, wherein the parallel-to-serial conversion unit comprises:
- a node terminated to a first level; and
- a plurality of first drivers configured to drive the node to a second level in response to the plurality of input data and the clock signals used in the parallel-to-serial conversion unit, wherein the plurality of data are serially output in response to a logic level of the node.

10. The parallel-to-serial converter as recited in claim 9, wherein each of the first drivers comprises:
- a first transistor configured to receive one of the plurality of input data; and
- a second transistor connected in series to the first transistor and configured to receive one of the clock signals used in the parallel-to-serial conversion unit.

11. A parallel-to-serial converter, comprising:
- a data input unit having a plurality of input blocks configured to receive a plurality of parallel data through four paths as valid data during enable periods of four clock signals having a 90-degree phase difference; and
- a parallel-to-serial conversion unit having a plurality of first drivers configured to sequentially select output signals of the data input unit during enable periods of four clock signals, which are inputted to the plurality of first drivers, respectively,
- wherein each of the plurality of clock signals inputted to the plurality of input blocks has 90-degree base difference from each of the plurality of clock signals inputted to the plurality of first drivers corresponding to the plurality of input blocks.

12. The parallel-to-serial converter as recited in claim 11, wherein the parallel-to-serial conversion unit selects the plurality of data as the valid data during the enable periods of the clock signals used in the parallel-to-serial conversion unit.

13. The parallel-to-serial converter as recited in claim 12, wherein the plurality of parallel data input to the data input unit are input as the valid data through the data input unit, and are output as valid output data of the parallel-to-serial conversion unit during only a period where the data are selected as the valid data through the parallel-to-serial conversion unit.

14. The parallel-to-serial converter as recited in claim 11, further comprising a delay unit configured to delay the clock signals used in the parallel-to-serial conversion unit by a predetermined amount, thereby ensuring a margin between the output data by using output signals of the delay unit.

15. A parallel-to-serial converter, comprising:
- a data input unit having a plurality of input blocks configured to receive a plurality of parallel data by using a plurality of clock signals having different phases;
- a parallel-to-serial conversion unit having a plurality of first drivers configured to sequentially select output signals of the data input unit by using a plurality of clock signals, which are inputted to the plurality of first drivers, respectively, and output serial data, wherein the parallel-to-serial conversion unit controls a drivability in outputting the serial data in response to a drivability control signal; and
- a data pattern detection unit configured to enable the drivability control signal when the serial data maintain the same logic level during more than a predetermined period and changes to an opposite logic level,
- wherein each of the plurality of clock signals inputted to the plurality of input blocks has a predetermined constant phase difference from each of the plurality of clock signals inputted to the plurality of first drivers corresponding to the plurality of input blocks.

16. The parallel-to-serial converter as recited in claim 15, wherein the drivability control signal is enabled while the serial data of the opposite logic level are output.

17. The parallel-to-serial converter as recited in claim 15, wherein the predetermined period is a 2-bit period.

18. The parallel-to-serial converter as recited in claim 15, wherein the data pattern detection units comprises:
- a first comparison unit configured to compare the logic levels of the serial data output during the predetermined period and output a comparison result;
- a second comparison unit configured to compare the comparison result of the first comparison unit with logic levels of the serial data to be output after the predetermined period, and enable the drivability control signal when the serial data have opposite logic levels to those of the serial data output during the predetermined period; and
- a pulse width control unit configured to control a width of an enable period of the drivability control signal.

19. The parallel-to-serial converter as recited in claim 18, wherein the first comparison unit maintains the comparison result until the outputting of the serial data to be output after the predetermined period is completed.

20. The parallel-to-serial converter as recited in claim 15, wherein the data input unit receives the plurality of parallel data as valid data during enable periods of the clock signals used in the data input unit.

21. The parallel-to-serial converter as recited in claim 20, wherein the parallel-to-serial conversion unit selects the plurality of parallel data as valid data during enable periods of the clock signals used in the parallel-to-serial conversion unit.

22. The parallel-to-serial converter as recited in claim 21, wherein the plurality of parallel data input to the data input unit are input as the valid data through the data input unit, and output as the valid serial data of the parallel-to-serial converter during only a period where the data are selected as the valid data through the parallel-to-serial conversion unit.

23. The parallel-to-serial converter as recited in claim 15, wherein the predetermined phase is adjusted to have a data width at which the serial data are not overlapped.

24. The parallel-to-serial converter as recited in claim 15, wherein the parallel-to-serial conversion unit comprises:
   a signal selection unit including:
      a plurality of first selectors respectively including a first transistor configured to receive one of the valid data of the data input unit, and a second transistor connected in series to the first transistor to receive one of the clock signals, the first selectors being configured to drive a first node to a first level in response to one of the valid data of the data input unit and one of the clock signals at the same time;
      a plurality of second selectors respectively including a third transistor configured to receive one of inverted valid data of the data input unit, and a fourth transistor connected in series to the third transistor to receive one of the clock signals, the second selectors being configured to drive a second node to a second level in response to one of the inverted valid data of the data input unit and one of the clock signals at the same time; and
   a driver configured to drive the first node and the second node to different logic levels in response to the logic levels of the first node and the second node; and
   a drivability control unit including transistors connected in parallel to one or more of the two transistors of the first and second selectors and turned on in response to the drivability control signal.

25. A parallel-to-serial converter, comprising:
a data input unit having a plurality of input blocks configured to receive a plurality of parallel data by using a plurality of first clock signals having different phases; and
a parallel-to-serial conversion unit having a plurality of first drivers configured to sequentially select and output an output signal of the data input unit by using a plurality of second clock signals,
wherein each of the plurality of first clock signals inputted to the plurality of input blocks have a predetermined phase difference from each of the plurality of second clock signals inputted to the plurality of first drivers, and
wherein the predetermined phase difference is adjusted to have a data width at which the output data of the parallel-to-serial converter are not overlapped.

* * * * *